(12) United States Patent
Tsumori et al.

(10) Patent No.: US 10,202,547 B2
(45) Date of Patent: Feb. 12, 2019

(54) ADJUSTMENT COMPONENT AND LIGHT-EMITTING DEVICE

(71) Applicant: Shin-Etsu Chemical Co., Ltd., Tokyo (JP)

(72) Inventors: Toshihiro Tsumori, Echizen (JP); Takehisa Minowa, Echizen (JP); Masami Kaneyoshi, Echizen (JP); Kazuhiro Wataya, Echizen (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/654,928

(22) PCT Filed: Dec. 26, 2013

(86) PCT No.: PCT/JP2013/084784
§ 371 (c)(1),
(2) Date: Jun. 23, 2015

(87) PCT Pub. No.: WO2014/104150
PCT Pub. Date: Jul. 3, 2014

(65) Prior Publication Data
US 2015/0354783 A1    Dec. 10, 2015

(30) Foreign Application Priority Data

Dec. 28, 2012   (JP) ................................ 2012-287358

(51) Int. Cl.
*F21K 99/00* (2016.01)
*C09K 11/67* (2006.01)
(Continued)

(52) U.S. Cl.
CPC ............ *C09K 11/676* (2013.01); *C09K 11/02* (2013.01); *C09K 11/617* (2013.01);
(Continued)

(58) Field of Classification Search
None
See application file for complete search history.

(56) References Cited

U.S. PATENT DOCUMENTS

2006/0169998 A1    8/2006  Radkov et al.
2007/0114562 A1*   5/2007  Radkov ................ C09K 11/665
                                                       257/103
(Continued)

FOREIGN PATENT DOCUMENTS

JP    2006-093372 A    4/2006
JP    2010-251621 A    11/2010
(Continued)

OTHER PUBLICATIONS

Office Action dated Aug. 25, 2015, issued in counterpart Japanese application No. 2014-554519 (3 pages).
(Continued)

*Primary Examiner* — Elmito Breval
(74) *Attorney, Agent, or Firm* — Westerman, Hattori, Daniels & Adrian, LLP

(57) ABSTRACT

Disclosed is an adjustment component that: includes a complex fluoride fluorophore represented by $A_2(M_{1-x}Mn_x)F_6$ (in the formula: M is one or two or more of type of tetravalent element selected from Si, Ti, Zr, Hf, Ge, and Sn; A is one or two or more of type of alkali metal selected from Li, Na, K, Rb, and Cs and including at least Na and/or K; and x is from 0.001 to 0.3); and adjusts the chromaticity and/or color rendering index of illumination light by absorbing light having a wavelength of from 420 nm to 490 nm inclusive, and emitting light including a red wavelength component.

7 Claims, 4 Drawing Sheets

(51) Int. Cl.
*C09K 11/61* (2006.01)
*H01J 61/44* (2006.01)
*C09K 11/02* (2006.01)
*C09K 11/77* (2006.01)
*F21K 9/232* (2016.01)
*F21K 9/27* (2016.01)
*F21K 9/64* (2016.01)
*F21V 9/30* (2018.01)
*H01L 33/50* (2010.01)
*F21Y 115/10* (2016.01)

(52) U.S. Cl.
CPC ......... *C09K 11/7774* (2013.01); *F21K 9/232* (2016.08); *F21K 9/27* (2016.08); *F21K 9/64* (2016.08); *F21V 9/30* (2018.02); *H01J 61/44* (2013.01); *F21Y 2115/10* (2016.08); *H01L 33/502* (2013.01)

(56) References Cited

U.S. PATENT DOCUMENTS

| | | | |
|---|---|---|---|
| 2007/0205712 A1 | 9/2007 | Radkov et al. | |
| 2008/0180948 A1* | 7/2008 | Yoon | C09K 11/0883 362/230 |
| 2009/0224177 A1* | 9/2009 | Kinomoto | C09K 11/7721 250/484.4 |
| 2011/0043101 A1* | 2/2011 | Masuda | C09K 11/0883 313/503 |
| 2012/0256220 A1 | 10/2012 | Katayama et al. | |
| 2012/0306356 A1* | 12/2012 | Yoon | C04B 35/597 313/503 |
| 2013/0278134 A1* | 10/2013 | Ko | H05B 33/12 313/503 |
| 2016/0049560 A1* | 2/2016 | Oh | H01L 33/504 257/98 |

FOREIGN PATENT DOCUMENTS

| | | |
|---|---|---|
| JP | 2010-272687 A | 12/2010 |
| JP | 2010-287680 A | 12/2010 |
| JP | 2011-29497 A | 2/2011 |
| JP | 2012-199539 A | 10/2012 |
| JP | 2012-227516 A | 11/2012 |
| WO | 2012/121304 A1 | 9/2013 |

OTHER PUBLICATIONS

International Search Report dated Jan. 28, 2014, issued in corresponding application No. PCT/JP2013/084784 (2 pages).

Extended (Supplementary) European Search Report dated Jun. 28, 2016, issued in counterpart European Patent Application No. 13869123.3. (6 pages).

Office Action dated Sep. 20, 2016, issued in counterpart Japanese Patent Application No. 2016-037469, with English translation. (6 pages).

* cited by examiner

ADJUSTMENT COMPONENT AND LIGHT-EMITTING DEVICE

TECHNICAL FIELD

This invention relates to an adjustment member which is used in order to improve the chromaticity or color rendering of illumination light of a light-emitting device, and a light-emitting device using the adjustment member.

BACKGROUND ART

Light-emitting diodes (LEDs) belong to a class of the most efficient light sources among currently available light sources. In particular, white LEDs find a rapidly expanding share in the market as the next-generation light source to replace incandescent lamps, fluorescent lamps, cold cathode fluorescent lamps (CCFL) for backlight, and halogen lamps. As one configuration for white LED, a white LED device (LED lighting device) constructed by combining a blue light-emitting diode (blue LED) with a phosphor capable of emitting light of longer wavelength, for example, yellow or green light upon blue light excitation is implemented on a commercial basis.

Among others, the current mainstream of the LED lighting device is a pseudo-white LED device comprising a blue LED and a yellow phosphor. Known examples of the yellow phosphor include $Y_3Al_5O_{12}$:Ce, (Y, Gd), (Al, Ga)$_5O_{12}$:Ce, (Y,Gd)$_3Al_5O_{12}$:Ce, Tb$_3Al_5O_{12}$:Ce, CaGa$_2S_4$:Eu, (Sr, Ca, Ba)$_2SiO_4$:Eu, and Ca-α-SiAlON:Eu.

In these pseudo-white LED devices, for example, a phosphor member (wavelength conversion member) composed of silicone resin or glass having yellow phosphor particles dispersed therein is disposed forward of the blue LED whereby the phosphor emits yellow fluorescence of center wavelength around 570 nm (wavelength 510 to 600 nm) in response to incident blue light of wavelength around 450 nm. The yellow light is combined with the light of the blue LED transmitted by the wavelength conversion member to produce pseudo-white light.

However, the pseudo-white LED device using a typical yellow phosphor, $Y_3Al_5O_{12}$:Ce emits light containing little of a green wavelength component of wavelength near 500 nm or a red wavelength component of wavelength 600 nm or longer. As a result, the light output of the pseudo-white LED device has a color rendering inferior to natural light, incandescent lamps and three-wavelength fluorescent lamps.

Thus, from the past, attempts are made to improve the color rendering of white LED devices. Among others, one attempt that intends to improve red light emission characteristics so as to endow the light output with a warm comfortable sense is to admix a red phosphor with a yellow or green phosphor in the wavelength conversion member of the pseudo-white LED device. Typical of the phosphors used are well-known nitride phosphors such as Sr—CaAlSiN$_3$:Ee$^{2+}$.

Among the white LED structures, the mainstream is a system in which a phosphor in admixture with resin or glass is disposed on or close to a blue LED, and the phosphor layer substantially integrated with the blue LED causes wavelength conversion to part or all of blue light for producing white light, which is referred to as white LED element.

Besides the method of mixing a yellow or green phosphor with a red phosphor to form a wavelength conversion member as mentioned above and the method of arranging a red emitting LED and a laser diode (LD) in parallel, means for adding a red component to light emission has not been proposed.

SUMMARY OF INVENTION

Technical Problem

An object of the invention, which has been made under the above-mentioned circumstances, is to provide an adjustment member capable of simply adding a red light component to the output of a light-emitting device while suppressing a lowering of emission efficiency, and a light-emitting device using the adjustment member.

Solution to Problem

Making extensive investigations to solve the outstanding problems and determining the extent of improvement by the addition of red light to pseudo-white light in the prior art, the inventors have found that when red light is added to yellow light to produce pseudo-white light as the light output, in a light quantity (photon quantity) of about 5 to 10%, white light of significantly improved color reproduction is obtained. Further studying how to obtain such red light, the inventors have found that when an adjustment member comprising a manganese-activated complex fluoride red phosphor is disposed in an LED light-emitting device capable of emitting pseudo-white light, for the purpose of color rendering improvement or chromaticity adjustment, a red light component is readily added to the output of the light-emitting device without a substantial lowering of emission efficiency. The present invention is predicated on these findings.

Accordingly, the invention provides an adjustment member and a light-emitting device as defined below.

[1] An adjustment member comprising a complex fluoride phosphor having the formula (1):

$$A_2(M_{1-x}Mn_x)F_6 \quad (1)$$

wherein M is one or two or more of tetravalent elements selected from Si, Ti, Zr, Hf, Ge, and Sn, A is one or two or more of alkali metals selected from Li, Na, K, Rb, and Cs and containing at least Na and/or K, and x is a number of 0.001 to 0.3, the adjustment member being adapted to absorb light having a wavelength of 420 nm to 490 nm and emit light containing a red wavelength component for thereby adjusting the chromaticity and/or color rendering index of illumination light.

[2] The adjustment member of [1], consisting of said complex fluoride phosphor.

[3] The adjustment member of [1] which is a resin molding having said complex fluoride phosphor dispersed therein.

[4] The adjustment member of any one of [1] to [3] wherein said complex fluoride phosphor is manganese-activated potassium silicofluoride of the formula: $K_2(Si_{1-x}Mn_x)F_6$ wherein x is as defined above.

[5] A light-emitting device for emitting blue light or pseudo-white light, comprising a light source capable of emitting light containing a blue light component of wavelength 420 to 490 nm, and the adjustment member of any one of [1] to [4].

Advantageous Effects of Invention

The light-emitting device using the adjustment member of the invention offers consistent light emission characteristics while suppressing a lowering of emission efficiency and preventing the variation of emission color which is caused by the differential dispersion of red phosphor particles that inevitably occurs in the prior art. By changing the size and phosphor content of the adjustment member, the chromaticity and color rendering performance of the light-emitting device can be readily adjusted.

In the light-emitting device of the invention, the adjustment member need not be disposed on the optical axis of the light source as long as light of wavelength 420 nm to 490 nm is incident on the adjustment member. For example, it may be disposed in proximity to a reflector or lamp shade. It causes a minimal decline of emission efficiency.

DESCRIPTION OF EMBODIMENTS

[Adjustment Member]

Figure 1:
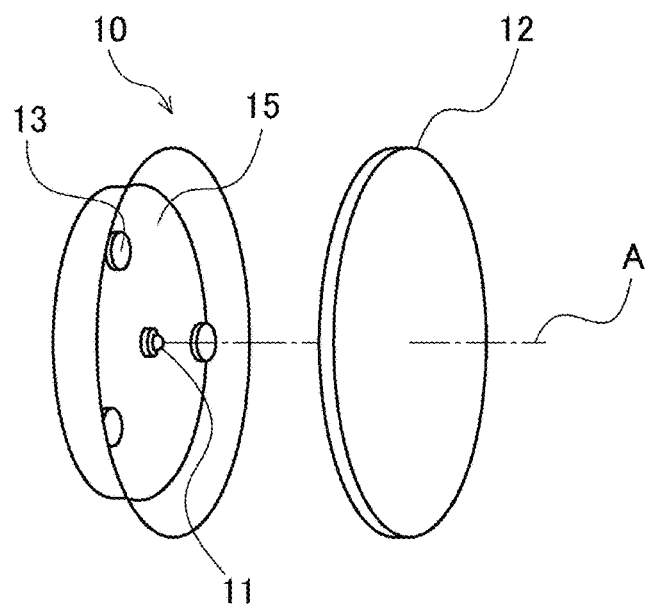
FIG. 1 is a schematic perspective view showing components of a light-emitting device according to a first embodiment of the invention.

The adjustment member of the invention is described below.

The adjustment member of the invention is defined as comprising a complex fluoride phosphor having the formula (1):

$$A_2(M_{1-x}Mn_x)F_6 \quad (1)$$

wherein M is one or more tetravalent elements selected from Si, Ti, Zr, Hf, Ge, and Sn, A is one or more alkali metals selected from Li, Na, K, Rb, and Cs and containing at least Na and/or K, and x is a number of 0.001 to 0.3, preferably 0.001 to 0.1, the adjustment member being adapted to absorb light having a wavelength of 420 nm to 490 nm and emit light containing a red wavelength component. The adjustment member is capable of adjusting the chromaticity and/or color rendering index of illumination light, especially LED illumination light.

The complex fluoride phosphor used herein is a red phosphor having the above formula (1), specifically a manganese-activated complex fluoride phosphor having the structure of complex fluoride $A_2MF_6$ in which part of constituent element is replaced by manganese. In the Mn-activated complex fluoride phosphor, preferably the activator Mn is a replacement at the site of tetravalent element in $A_2MF_6$, as tetravalent manganese ($Mn^{4+}$), though the replacement site is not limited thereto. In this sense, the phosphor may also be expressed as $A_2MF_6$:Mn. Of these complex fluoride phosphors, manganese-activated potassium silicofluoride of the formula: $K_2(Si_{1-x}Mn_x)F_6$ wherein x is as defined above is especially preferred.

The manganese-activated complex fluoride phosphor emits red light having an emission peak or maximum emission peak in the wavelength range of 600 to 660 nm, when excited by blue light of wavelength 420 to 490 nm, preferably 440 to 470 nm. The complex fluoride phosphor is also characterized by a low absorption of light of wavelength 500 nm or longer.

It is noted that the complex fluoride phosphor of formula (1) may be one produced by a prior art well-known method, for example, by dissolving or dispersing a metal fluoride starting material in hydrofluoric acid, and heating the solution for evaporation to dryness.

The manganese-activated complex fluoride phosphor is preferably particulate and its particle size is preferably 2 μm to 200 μm, more preferably 10 μm to 60 μm, expressed as a volume basis 50% cumulative particle diameter D50 in particle size distribution. If the particle size D50 is less than 2 μm, the emission efficiency of the phosphor may decline. If phosphor particles are coarse, no essential problems arise with respect to light emission, but there may be the drawback that the step of mixing the phosphor with a resin results in a non-uniform phosphor distribution. For this reason, the phosphor with a D50 of up to 200 μm is convenient.

For the measurement of particle size in the practice of the invention, a dry laser diffraction scattering method of spraying a test powder in air or dispersing a test powder suspended in air, irradiating laser light thereto, and determining a particle diameter from the diffraction pattern is preferable since the measurement is not affected by humidity and even a particle size distribution can be evaluated.

Preferably, the adjustment member consists of the aforementioned complex fluoride phosphor. For example, it may be formed by applying the particulate complex fluoride phosphor onto a substrate in a two- or three-dimensional fashion. Its shape is not particularly limited as long as it is applicable to the light-emitting device.

Also preferably, the adjustment member is a resin molding having the complex fluoride phosphor dispersed therein. In this embodiment, the adjustment member may be of any shape like plate, disk or ring shape, because the shape is not particularly limited as long as it is applicable to the light-emitting device.

In the embodiment wherein the adjustment member is a resin molding having the complex fluoride phosphor dispersed therein, the content of manganese-activated complex fluoride phosphor in the adjustment member, that is, the concentration of phosphor milled in the resin is typically 2 to 30% by weight, preferably 3 to 20% by weight, and more preferably 5 to 10% by weight, although the phosphor content varies with the thickness of the adjustment member and the desired chromaticity or color rendering. If the phosphor content exceeds 30 wt %, more friction and wear may occur between the phosphor particles and the working screw of the molding machine during the milling step, and as a result, the adjustment member may be colored. If the phosphor content is excessively high, phosphor particles may locally agglomerate in the encapsulant resin, resulting in the adjustment member having a non-uniform emission distribution. With a phosphor content of less than 2 wt %, the adjusting effect may be reduced. It is not always prohibited to use the phosphor outside the range of 2 to 30 wt %.

Although the resin for encapsulating the phosphor is not particularly limited, preference is given to a thermosetting or thermoplastic resin, especially thermoplastic resin which is chemically resistant to acids and alkalis, fully proof to humidity, and moldable in a relatively short time by injection molding.

In the embodiment wherein the resin for encapsulating the phosphor is a thermoplastic resin, the upper limit of molding temperature is preferably 250° C. or lower, more preferably 200° C. or lower. There is a possibility that the manganese-activated complex fluoride phosphor is thermally decomposed at a temperature in excess of 250° C. On the other hand, the lower limit of molding temperature is not particularly limited as long as the thermoplastic resin is softened. On choice of the thermoplastic resin, a thermoplastic resin which does not undergo heat deflection during service is preferably selected in consideration of heat generation of the light source.

Examples of the light transmitting thermoplastic resin used herein include polyolefins such as polypropylene, polystyrenes such as general purpose polystyrene (GPPS), and styrene copolymers such as styrene-maleic acid copolymers, styrene-methyl methacrylate copolymers and acrylonitrile-butadiene-styrene (ABS) copolymers. One or more resins selected from these are preferably used. These resins allow for satisfactory mixing of the phosphor, and eliminate the risk of decomposition or degradation of the resin or phosphor by the impact of the molding temperature and heat generation of the light source To the resin of the adjustment member, like prior art thermoplastic resin materials, additives such as antioxidant, stabilizers including photo-stabilizer and UV absorber, and mold lubricant may be compounded in an amount of 0.1 to 0.3% by weight, depending on a particular application.

Also, a photo-diffusing agent may be mixed for the purpose of making uniform the emission of the adjustment member. Exemplary photo-diffusing agents include powdered inorganic ceramics such as talc, aluminum oxide, silicon oxide, aluminum silicate, and yttrium oxide. Inter alia, aluminum oxide and silicon oxide are preferred because of high optical transparency and a minimal loss of transmitted light when incorporated in resin. The photo-diffusing agent preferably has a particle size D50 of 0.005 to 5 μm.

In the practice of the invention, a member is preferably prepared by furnishing the thermoplastic resin and auxiliary agents as resin matrix and the manganese-activated complex fluoride phosphor in powder form, feeding them into a twin-screw extruder, milling them such that the phosphor powder is incorporated in the heated resin matrix, and heat molding the resin matrix into any desired shape for a particular application, like general-purpose plastic materials. For example, after the resin matrix and the phosphor are milled, the material may be directly molded into the desired thickness and shape suitable as an adjustment member. Alternatively, once the material is molded into pellets, the pelleted material may be molded into an adjustment member of the desired thickness and shape when necessary.

Preferably the adjustment member has a thickness of 1 to 20 mm. If the thickness is less than 1 mm, the adjustment member may become difficult to maintain mechanical strength. A thickness in excess of 20 mm may lead to a substantial loss of light entering the adjustment member by the resin.

The adjustment member thus obtained becomes a resin molding in which manganese-activated complex fluoride phosphor particles are encapsulated with the preselected resin without alteration. The adjustment member produces fluorescence having an emission peak or maximum emission peak in the red wavelength region of about 600 to 660 nm when excited by blue light of wavelength 420 to 490 nm. Accordingly, when the adjustment member comprising manganese-activated complex fluoride phosphor is applied to a light-emitting device capable of emitting blue light of wavelength 420 to 490 nm, red light of wavelength about 600 to 660 nm is added to the emission spectrum of the device to achieve an adjustment of chromaticity and an improvement in color rendering. Also, the adjustment member has a likelihood that blue light reaches the interior of the adjustment member since the manganese-activated complex fluoride phosphor has a relatively low coefficient of absorption of blue light of wavelength 420 to 490 nm. It is thus avoided that only a portion of the adjustment member that receives blue light becomes emissive, and the adjustment member provides light emission over its entirety. That is, the adjustment member becomes an emission source over a wide range commensurate to its shape and dimensions, and is suitable as an auxiliary member for adjusting the chromaticity and color rendering of light in the light-emitting device.

[Light-Emitting Device]

Now the light-emitting device of the invention is described.

The invention relates to a light-emitting device comprising a light source capable of emitting excitation light containing a blue light component of wavelength 420 to 490 nm, and the adjustment member for wavelength conversion of the excitation light. The adjustment member is disposed at or about the periphery of the light source in the light-emitting device whereby the LED light-emitting device is improved in color rendering and chromaticity.

Specifically, the invention relates to a light-emitting device comprising a light source capable of emitting blue light of wavelength 420 to 490 nm, wherein the adjustment member is disposed at a position not interfering with light emission of the light-emitting device, typically at the periphery of the light source. With the adjustment member in place, fluorescence having an emission peak or maximum emission peak in the red wavelength region of about 600 to 660 nm is added to the emission spectrum of the device to achieve an improvement in chromaticity or color rendering. Since the adjustment member is mostly excited by light propagating laterally from the light source, the attenuation of excitation light emitted from the light source in the optical axis direction, that causes a drop of illuminance of the lighting fixture, is minimal. There is a minimal decline of emission efficiency.

Below the light-emitting device of the invention is specifically illustrated although the invention is not limited thereto.

FIG. 1 is a perspective view showing components of a light-emitting device according to a first embodiment of the invention, illustrating an exemplary LED projector.

The light-emitting device of the invention is depicted at 10 in FIG. 1 as comprising an LED light source 11 capable of emitting blue light, having an optical axis A, an adjustment member 13 disposed at a position that is inside a region over which the LED light source 11 irradiates light, but outside an irradiation region of light parallel to the optical axis A, and a wavelength conversion member 12 disposed on optical axis A and containing a phosphor capable of absorbing blue light and emitting light of different wavelength from the phosphor in the adjustment member 13. On the assumption that a circumferential surface passes the periphery of the emissive surface of the LED light source and extends parallel to its optical axis, the irradiation region of light parallel to the optical axis refers to the region delimited and confined by this circumferential surface. Preferably the adjustment member 13 is disposed at a position that does not block the region between the LED light source 11 and the wavelength conversion member 12 where the excitation light passes, for example, a position other than forward in the emission direction of the LED light source (e.g., lateral or backward position).

The LED light source 11 used herein should emit light capable of exciting the phosphors in the wavelength conversion member 12 and the adjustment member 13 included in the light-emitting device 10, specifically blue light, preferably blue light of emission wavelength 420 to 490 nm, or light containing the blue light component. While the LED light source 11 is depicted in FIG. 1 as comprising a single LED chip, a light source comprising a plurality of LED chips is also preferable for LED lighting purpose.

The wavelength conversion member 12 is preferably a resin molding having a yellow or green phosphor dispersed therein. For example, it is a yellow wavelength conversion member in which a prior art well-known yellow phosphor such as $Y_3Al_5O_{12}:Ce^{3+}$ or $Lu_3Al_5O_{12}:Ce^{3+}$ is incorporated in a thermoplastic resin.

The content of the phosphor in the wavelength conversion member 12 is determined in consideration of the quantity of incident blue light, the quantity of light emitted in the yellow wavelength region, the transmittance of blue light, and the like. In the case of a plate of 2 mm thick containing $Y_3Al_5O_{12}:Ce^{3+}$ phosphor, for example, the phosphor concentration is preferably 0.5 to 5% by weight, more preferably 2 to 4% by weight.

Figure 2:
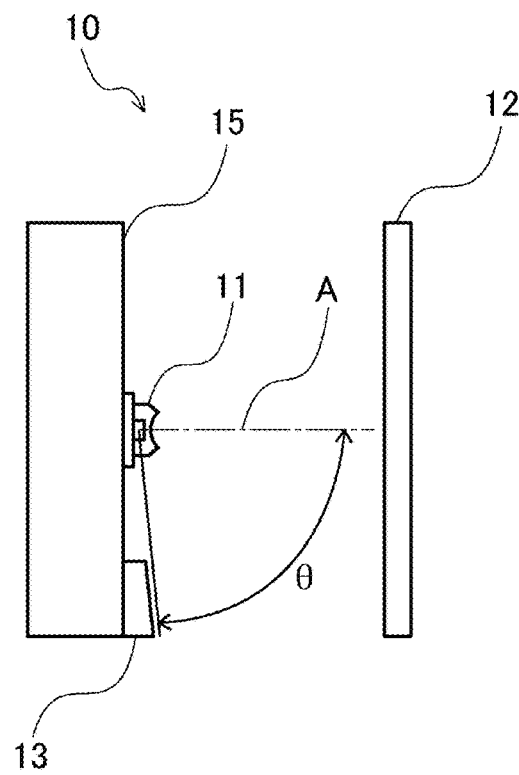
FIG. 2 is a schematic cross-sectional view showing the disposition of the adjustment member in the light-emitting device of FIG. 1.

The adjustment member 13 is a member as defined above. The size and disposition of the adjustment member 13 may be determined from a balance between the quantity of red wavelength component light (red light) emitted in accordance with the luminous intensity distribution of the LED light source 11, and the quantity of light output of the light-emitting device. When the position of the adjustment member 13 is expressed by an angle θ relative to the optical axis A of the LED light source 11, as shown in FIG. 2, the angle θ is preferably in the range of 10° to 180°, more preferably 30° to 90°, and even more preferably 60° to 90°. A position corresponding to an exit angle of less than 10° may reduce the quantity of light output of the light-emitting device 10.

Also preferably, as shown in FIG. 2, the adjustment member 13 is disposed on a reflector 15 which is disposed backward of the LED light source 11.

Furthermore, for uniform chromaticity of light output of the light-emitting device 10, the adjustment member 13 is preferably disposed circumferentially and equally with respect to the optical axis A of the LED light source 11. For example, as shown in FIG. 1, a plurality of compact disk shaped adjustment members 13 may be equally spaced on a common circle about the optical axis A. Alternatively, a ring-shaped (or annular) adjustment member 13 may be aligned with the optical axis A. Then, while a light output exits the light-emitting device 10 in the direction of optical axis A, light exits the adjustment member 13 uniformly around the light output. The light-emitting device 10 produces a light output having uniform color rendering and chromaticity.

Since the light-emitting device 10 of the invention is constructed such that the phosphors in both the wavelength conversion member 12 and the adjustment member 13 are excited by the excitation light from the common LED light source 11, uniform light of consistent color rendering or chromaticity is produced without a difference in emission color which is often found in a light-emitting device comprising a plurality of white LED light sources, due to variations of LED output. In the light-emitting device 10 of the invention wherein the adjustment member 13 is excited by light propagating laterally from the LED light source 11 and light reflected by the wavelength conversion member 12, the attenuation of excitation light emitted from the LED light source 11 in the optical axis direction and fluorescence from the wavelength conversion member 12, that causes a drop of illuminance of the lighting fixture, is minimal. There is no loss of emission efficiency as compared with the prior art. Also the light-emitting device 10 enables to improve the color rendering and chromaticity of light output via simple adjustment because the wavelength conversion member 12 and adjustment member 13 may be mounted so as to comply with light emission with the desired chromaticity, at the last stage of assembly of the light-emitting device 10. Furthermore, since the adjustment member 13 is spatially apart from the LED light source, it is unlikely that the adjustment member 13 is heated at high temperature, with the advantage that properties of the phosphor therein little vary.

Figure 3:
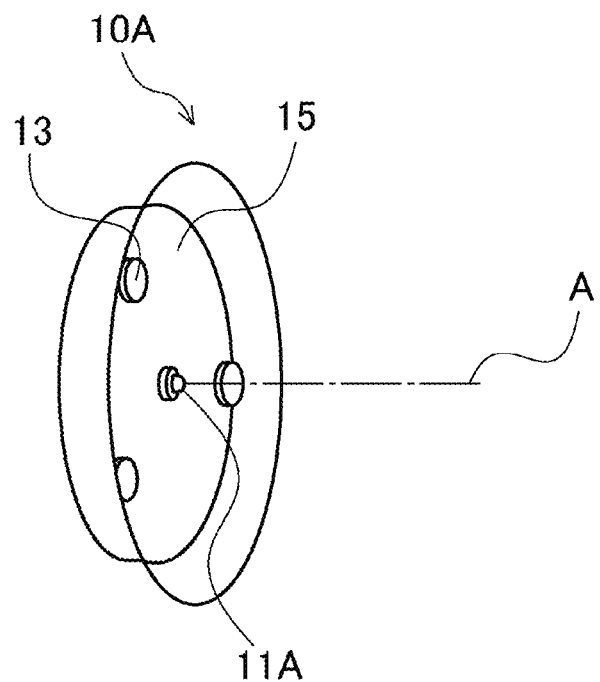
FIG. 3 is a schematic perspective view showing components of a light-emitting device according to another version of the first embodiment of the invention.

FIG. 3 is a perspective view showing components of a light-emitting device according to another version of the first embodiment of the invention.

The light-emitting device of the invention is depicted at 10A in FIG. 3 as comprising an LED light source 11A capable of emitting pseudo-white light containing a blue wavelength component and an adjustment member 13 disposed at a position that is inside a region over which the LED light source 11A irradiates light, but outside an irradiation region of light parallel to the optical axis A. The adjustment member 13 is disposed off the direction in which light emitted by the LED light source 11A exits the light-emitting device 10A, and preferably at a position other than forward in the light emission direction of the LED light source 11A, for example, a lateral or backward position.

The LED light source 11A used herein is a light source of pseudo-white light emission having a color temperature of at least 4,000K, for example, comprising a blue LED chip capable of emitting blue light of wavelength 420 to 490 nm, preferably 440 to 470 nm, and a wavelength conversion layer which is formed by coating the surface of the blue LED with a resin coating composition containing a yellow or green phosphor.

The adjustment member 13 and reflector 15 are the same as in FIG. 1. Preferably the adjustment member 13 is disposed at a position corresponding to the same angle θ relative to the optical axis of the LED light source 11A as in FIG. 1.

The light-emitting device 10A of the above-mentioned construction operates such that once the LED light source 11A emits white light, a fraction of the white light propagating laterally from the LED light source 11A enters the adjustment member 13 where blue light in the white light is converted to red light having an emission or maximum emission peak in the red wavelength region of about 600 to 660 nm. Thus blue light, yellow light and red light are available in a predetermined proportion, resulting in the light-emitting device producing white light with improved color rendering and chromaticity.

Figure 4:
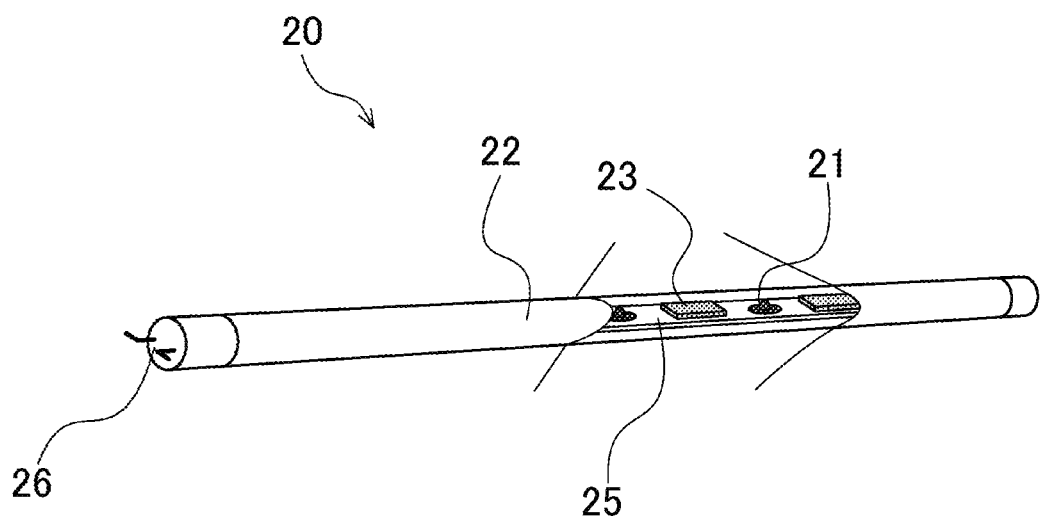
FIG. 4 is a schematic perspective view showing components of a light-emitting device according to a second embodiment of the invention.

Next, FIG. 4 shows components of a light-emitting device according to a second embodiment of the invention. FIG. 4 is a partially cutaway view so that internal components in a center-to-right portion may be seen.

The inventive light-emitting device of linear fluorescent lamp type is depicted at 20 in FIG. 4 as comprising an LED light source 21 capable of emitting blue light, a wavelength conversion member 22 comprising a phosphor capable of emitting light upon absorption of blue light, and an adjustment member 23. Optionally, the device may further have a reflector 25. The LED light sources 21 and adjustment members 23 are alternately disposed in the longitudinal direction of the linear tube. Electric power is supplied to the LED light sources 21 via electrodes 26 at the end of the linear tube.

The light-emitting device 20 of the above-mentioned construction operates such that once the LED light source 21 emits blue light, the blue light enters the wavelength conversion member 22 where a portion of blue light is absorbed by the phosphor therein and converted to light (yellow light) containing a yellow wavelength region (or green wavelength region), whereupon the light emerges from the wavelength conversion member 22 together with the remainder of blue light transmitted by the wavelength conversion member 22. On the other hand, the adjustment member 23 receives blue light propagating laterally from an adjacent LED light source 21 and blue light reflected by the wavelength conversion member 22, whereupon the blue light inputs are absorbed by the red phosphor in the adjustment member 23 and converted to light (red light) containing a red wavelength region, which exits in the direction of an optical axis (outward of the linear tube). Thus blue light, yellow light and red light are available in a predetermined proportion, resulting in the light-emitting device 20 producing pseudo-white light with warmth.

Since the light-emitting device 20 of the invention is constructed such that the phosphors in both the wavelength conversion member 22 and the adjustment member 23 are excited by the excitation light from the common LED light source 21, uniform light of consistent chromaticity is produced without a difference in emission color which is often found in a light-emitting device comprising a plurality of LED light sources of different emission wavelengths, due to variations of LED output. In the light-emitting device 20 of the invention wherein the adjustment member 23 is excited by light propagating laterally from the LED light source 21 and light reflected by the wavelength conversion member 22, the attenuation of excitation light emitted from the LED light source 21 in the optical axis direction and fluorescence from the wavelength conversion member 22, that causes a drop of illuminance of the lighting fixture, is minimal. There is no loss of emission efficiency as compared with the prior art. Also the light-emitting device 20 offers a high freedom of emission toning via simple adjustment because the adjustment member 23 whose phosphor content has been adjusted in proportion to the desired chromaticity of emission may be mounted at the last stage of assembly of the light-emitting device 20. Furthermore, since the wavelength conversion member 22 and adjustment member 23 are spatially independent and apart from the LED light source (light-emitting chip), it is unlikely that they are heated at high temperature, ensuring stable properties of the phosphors therein and a long lifetime.

Figure 5:
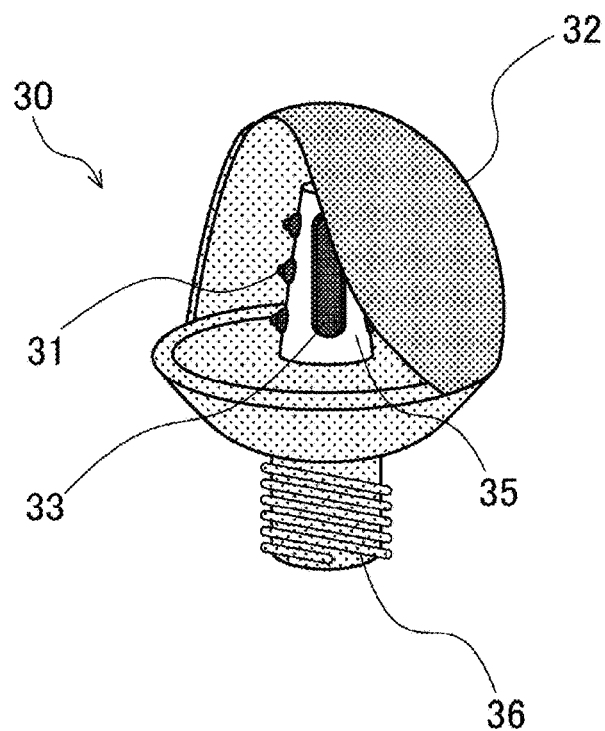
FIG. 5 is a schematic perspective view showing components of a light-emitting device according to a third embodiment of the invention.

Next, FIG. 5 shows components of a light-emitting device according to a third embodiment of the invention. FIG. 5 is a partially cutaway view so that internal components in a center-to-left portion may be seen.

The inventive light-emitting device of the bulb type is depicted at 30 in FIG. 5 as comprising a bulb cover form of wavelength conversion member 32, a reflector 35 in the form of an upward tapered cylinder serving as a support, received within the bulb cover, an LED light source 31 capable of emitting blue light, and a plate-shaped adjustment member 33, the wavelength conversion member 32 comprising a phosphor capable of absorbing blue light and emitting light of different wavelength from the phosphor in the adjustment member 33. The LED light sources 31 and adjustment members 33 are disposed on the peripheral surface of reflector 35 alternately in the circumferential direction of reflector 35. In the illustrated embodiment, each LED light source 31 has an optical axis perpendicular to the peripheral surface of reflector 35, and the adjustment member 33 is disposed at a position that is inside a region over which the LED light source 31 irradiates light, but outside an irradiation region of light parallel to the optical axis of the LED light source. The adjustment member 33 is disposed at a position lateral or backward of the LED light source 31 in the light emission direction. Electric power is supplied to the LED light sources 31 via a base 36.

The light-emitting device 30 of the above-mentioned construction operates such that once the LED light source 31 emits blue light, the blue light enters the wavelength conversion member 32 where a portion of blue light is absorbed by the phosphor therein and converted to light (yellow light or green light) including a yellow wavelength region (or green wavelength region), whereupon the light emerges from the wavelength conversion member 32 together with the remainder of blue light transmitted by the wavelength conversion member 32. On the other hand, the adjustment member 33 receives blue light propagating laterally from an adjacent LED light source 31 and blue light reflected by the wavelength conversion member 32, whereupon the blue light inputs are absorbed by the red phosphor in the adjustment member 33 and converted to light (red light) containing a red wavelength region, which exits in the direction of an optical axis (outward of the bulb cover). Thus blue light, yellow light and red light are available in a predetermined proportion, resulting in the light-emitting device 30 producing white light with improved color rendering.

Since the light-emitting device 30 of the invention is constructed such that the phosphors in both the wavelength conversion member 32 and the adjustment member 33 are excited by the excitation light from the common LED light source 31, uniform light of consistent chromaticity is produced without a difference in emission color which is often found in a light-emitting device comprising a plurality of LED light sources of different emission wavelengths, due to variations of LED output. In the light-emitting device 30 of the invention wherein the adjustment member 33 is excited by light propagating laterally from the LED light source 31 and light reflected by the wavelength conversion member 32, the attenuation of excitation light emitted from the LED light source 31 in the optical axis direction and fluorescence from the wavelength conversion member 32, that causes a drop of illuminance of the lighting fixture, is minimal. There is no loss of emission efficiency as compared with the prior art. Also the light-emitting device 30 offers a high freedom of emission toning via simple adjustment because the adjustment member 33 whose phosphor content has been adjusted in proportion to the desired chromaticity of emission may be mounted at the last stage of assembly of the light-emitting device 30. Furthermore, since the wavelength conversion member 32 and adjustment member 33 are spatially independent and apart from the LED light source (light-emitting chip), it is unlikely that they are heated at high temperature, ensuring stable properties of the phosphors therein and a long lifetime.

Although reference is made to the white light-emitting device, the adjustment member is also applicable to a blue light-emitting device comprising a blue LED light source capable of emitting light containing blue light of wavelength 420 to 490 nm as a component.

The light-emitting device of the invention is suited as a light-emitting device of remote phosphor technology wherein a wavelength conversion member is spaced apart from a blue LED light source by a gas or vacuum layer. Because of its light distribution characteristics distinguishable from general LED light-emitting devices, such as surface emission and a wide radiation angle, the remote phosphor system is best suited as illuminators for providing illumination over a wide area.

EXAMPLES

Examples and Comparative Examples are given below for illustrating the invention, but the invention is not limited thereto.

Examples 1 to 4 and Comparative Examples 1 to 4

An LED light-emitting device was manufactured under the following conditions.

On a twin-screw extruder, 0.5 kg of $K_2(Si_{0.97}Mn_{0.03})F_6$ phosphor powder having a particle size D50 of 17.6 μm and D90 of 30.2 μm was mixed with 4.5 kg of transparent polypropylene pellets, yielding the $K_2(Si_{0.97}Mn_{0.03})F_6$-loaded polypropylene pellets having a $K_2(Si_{0.97}Mn_{0.03})F_6$ content of 10 wt %.

Using a 20-t horizontal injection molding machine, the $K_2(Si_{0.97}Mn_{0.03})F_6$-loaded polypropylene pellets were molded into a ring-shaped red adjustment member having an inner diameter of 90 mm, an outer diameter of 96 mm and a thickness of 10 mm.

Also, pellets were prepared by incorporating 3 to 10 wt % of $Y_3Al_5O_{12}$:Ce phosphor having a particle size D50 of 50 μm in polycarbonate resin. The polycarbonate pellets were injection molded into a disk-shaped yellow wavelength conversion member having a thickness of 2 mm and a diameter of 100 mm.

Figure 6:
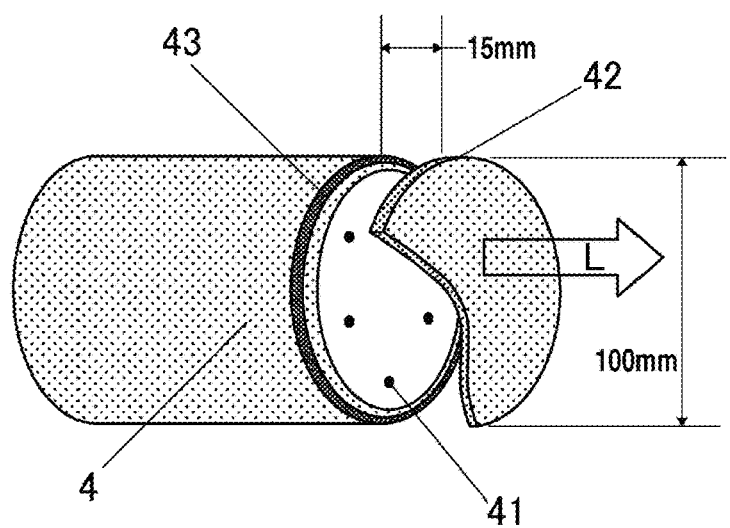
FIG. 6 is a schematic perspective view showing components of a pseudo-white LED lighting device used for evaluation in Examples.

An LED light-emitting device was constructed as shown in FIG. 6 by placing the adjustment member 43 on a circumference about an optical axis of an LED light source 41, which was coplanar with an array of LED chips (LED light source) 41 included in an LED projector 4 (GL-RB100 by Hino Electronic Corp, using six 2-W blue LED chips XT-E Royal Blue by Cree, Inc.). Six LED chips 41 were situated within the ring of adjustment member 43. At this point, the adjustment member 43 was disposed at a position corresponding to an exit angle of 90° relative to the optical axis of the LED light source 41. Also, the wavelength conversion member 42 was disposed on the optical axis and forward of the LED projector 4 (in emission direction L) and spaced 15 mm apart from the LED chips 41. For comparison sake, an LED light-emitting device was also prepared in which the adjustment member was omitted and only the wavelength conversion member was disposed.

While the LED light-emitting device was operated to illuminate white light toward a white screen at a distance of 20 cm, the illuminance, color temperature, average color rendering index Ra, and special color rendering index ΔR9 of white light were measured by means of an illuminance spectrophotometer CL-500A (Konica-Minolta Optics Co., Ltd.), from which color reproduction was judged. The results are shown in Table 1.

TABLE 1

| | Adjusment member Phosphor content (wt %) | Wavelength conversion member Phosphor content (wt %) | Illuminance (lx) | Color temperature (K) | Average color rendering index Ra | Special color rendering index ΔR9 |
|---|---|---|---|---|---|---|
| Example 1 | 10 | 10 | 3176 | 3320 | 68 | −9 |
| Example 2 | 10 | 5 | 3076 | 3794 | 75 | 16 |
| Example 3 | 10 | 4 | 2579 | 5895 | 90 | 92 |
| Example 4 | 10 | 3 | 2481 | 14710 | 80 | 12 |
| Comparative Example 1 | — | 10 | 2731 | 3539 | 60 | −59 |
| Comparative Example 2 | — | 5 | 3051 | 4154 | 66 | −40 |
| Comparative Example 3 | — | 4 | 2515 | 7235 | 81 | 28 |
| Comparative Example 4 | — | 3 | 2365 | * | * | * |

Figure 7A:
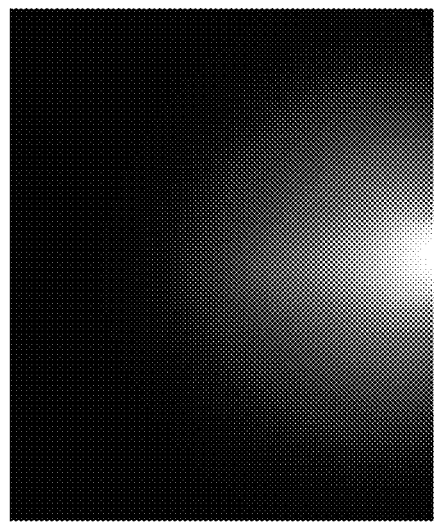
FIG. 7 shows perspective images of emissions from the adjustment member of Example 3 and the wavelength conversion member of Comparative Example 3.
Figure 7B:
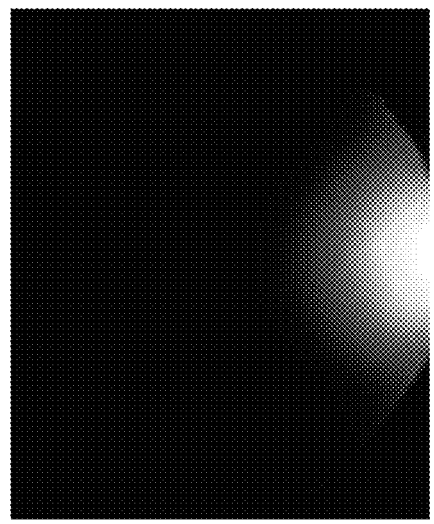

* unmeasurable because a blue component in white light under test is excessive relative to other color components Using the above pellets for the adjustment member of Example 3 and the wavelength conversion member of Comparative Example 3, a plate-shaped adjustment member and wavelength conversion member of 2 mm thick and 40 mm squares were prepared. When light from a blue LED (wavelength 460 nm) was irradiated to the 40-mm square surface of the adjustment member and wavelength conversion member in a perpendicular direction, the light emission from the adjustment member and wavelength conversion member was visually observed on the back side opposed to the irradiated surface. FIG. 7 is a perspective image of such light emission. In the case of the wavelength conversion member of Comparative Example 3, as shown in FIG. 7(B), only the portion (right side in the figure) receiving blue light as excitation light looks bright due to light emission. In the case of the adjustment member of Example 3, as shown in FIG. 7(A), not only the portion receiving blue light as excitation light, but also the surrounding portion (center to left side in the figure) provide light emission, indicating that the adjustment member has a wide emission range.

It has been demonstrated that the inventive LED light-emitting device using the adjustment member achieves significant improvements in average color rendering index Ra and special color rendering index ΔR9 over the LED light-emitting device using only the yellow wavelength conversion member. There is observed a tendency that illuminance is improved more or less on use of the adjustment member.

Examples 5 to 12 and Comparative Example 5

An LED light-emitting device was manufactured under the following conditions.

On a twin-screw extruder, $K_2(Si_{0.97}Mn_{0.03})F_6$ phosphor powder having a particle size D50 of 17.6 μm and D90 of 30.2 μm was mixed with transparent polypropylene pellets, yielding the $K_2(Si_{0.97}Mn_{0.03})F_6$-loaded polypropylene pellets having a $K_2(Si_{0.97}Mn_{0.03})F_6$ content of 12 wt %.

Using a 20-t horizontal injection molding machine, the $K_2(Si_{0.97}Mn_{0.03})F_6$-loaded polypropylene pellets were molded into a rectangular plate-shaped adjustment member of 25 mm×30 mm and 2 mm thick.

Also, pellets were prepared by incorporating 4 wt % of $Y_3Al_5O_{12}$:Ce phosphor having a particle size D50 of 50 μm in polymethyl methacrylate resin. The pellets were injection molded into a disk-shaped yellow wavelength conversion member having a thickness of 2 mm and a diameter of 100 mm.

An LED light-emitting device was constructed by placing 1 to 8 adjustment members on the LED chip array plane of an LED projector GL-100 (input 15 W, emission wavelength 450 nm, Hino Electronic Corp.). At this point, the adjustment member was disposed at a position corresponding to an exit angle of 90° relative to the optical axis of the LED light source. Also, the wavelength conversion member was disposed on the optical axis and forward of the LED projector and spaced 40 mm apart from the LED chips. For comparison sake, an LED light-emitting device was also prepared in which the adjustment member was omitted and only the wavelength conversion member was disposed.

Figure 8:
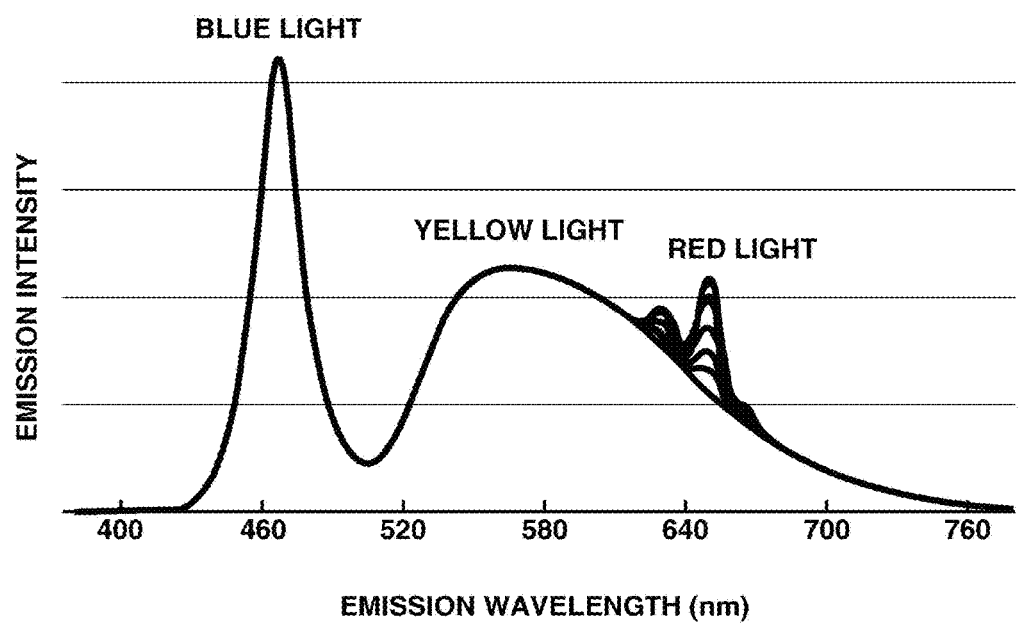
FIG. 8 is a diagram showing the emission spectra of the light-emitting devices in Examples 5 to 12 and Comparative Example 5.

While the LED light-emitting device was operated to illuminate white light toward a white screen at a distance of 20 cm, the color temperature, deviation (Δuv), average color rendering index Ra, and special color rendering index ΔR9 of white light were measured by means of an illuminance spectrophotometer CL-500A (Konica-Minolta Optics Co., Ltd.), from which color reproduction was judged. The results are shown in Table 2. FIG. 8 illustrates the emission spectra of the devices.

TABLE 2

| | Number of adjustment members | Color temperature (K) | Deviation (Δuv) | Average color rendering index Ra | Special color rendering index ΔR9 |
|---|---|---|---|---|---|
| Comparative Example 5 | 0 | 5928 | 0.0041 | 72 | −23 |
| Example 5 | 1 | 6053 | 0.0034 | 73 | −20 |
| Example 6 | 2 | 5921 | 0.0019 | 74 | −8 |
| Example 7 | 3 | 5883 | 0.0004 | 76 | 2 |
| Example 8 | 4 | 5726 | −0.0008 | 77 | 12 |
| Example 9 | 5 | 5629 | −0.0025 | 79 | 24 |
| Example 10 | 6 | 5473 | −0.0015 | 78 | 22 |
| Example 11 | 7 | 5397 | −0.0019 | 79 | 25 |
| Example 12 | 8 | 5352 | −0.0022 | 79 | 28 |

It is evident from the above that as the number of adjustment members according to the invention is increased, the average color rendering index Ra and special color rendering index ΔR9 are further improved. As shown in FIG. 8, the quantity of red light is increased without substantially changing the quantity of yellow light.

Although the invention has been described with reference to the embodiments illustrated in the drawing, the invention is not limited thereto, and other embodiments may occur to, or various additions, changes and deletions may be made by those skilled in the art. All such embodiments fall in the scope of the invention as long as the advantages and results of the invention are obtainable.

REFERENCE SIGNS LIST 10, 10A, 20, 30 light-emitting device
11, 11A, 21, 31, 41 LED light source
12, 22, 32, 42 wavelength conversion member
13, 23, 33, 43 adjustment member
15, 25, 35 reflector
26 electrode
36 base
4 LED projector
A optical axis
L light emission direction

The invention claimed is:
1. A light-emitting device emitting pseudo-white light comprising:
an LED light source capable of emitting light containing blue light component of wavelength 420 to 490 nm,
a wavelength conversion member disposed on optical axis and containing a yellow or green phosphor capable of absorbing blue light and emitting first light, the wavelength conversion member being a resin molding including the phosphor dispersed therein, and
an adjustment member spatially independent and apart from the LED light source and the wavelength conversion member, the adjustment member comprising a complex fluoride phosphor having the formula (1):

$$A_2(M_{1-x}Mn_x)F_6 \tag{1}$$

wherein M is one or two or more of tetravalent elements selected from Si, Ti, Zr, Hf, Ge, and Sn, A is one or two or more of alkali metals selected from Li, Na, K, Rb, and Cs and containing at least Na and/or K, and x is a number of 0.001 to 0.3, and the adjustment member is adapted to absorb light having a wavelength of 420 nm to 490 nm and emit second light containing a red wavelength component for thereby adjusting the chromaticity and/or color rendering index of illumination light,
the adjustment member being a resin molding including the complex fluoride phosphor dispersed therein,
wherein the light-emitting device being a remote phosphor type wherein the wavelength conversion member is spaced apart from the LED light source by a gas or vacuum layer, and wherein the first light emitted by the wavelength conversion member is different in wavelength from the second light emitted by the adjustment member.

2. The light-emitting device of claim 1, wherein said complex fluoride phosphor is manganese-activated potassium silicofluoride of the formula: $K_2(Si_{1-x}Mn_x)F_6$ wherein x is as defined above.

3. The light-emitting device of claim 1, wherein the adjustment member has a thickness of 1 to 20 mm.

4. The light-emitting device of claim 1, wherein the phosphor in the wavelength conversion member is $Y_3Al_5O_{12}:Ce^{3+}$ or $Lu_3Al_5O_{12}:Ce^{3+}$.

5. The light-emitting device of claim 2, wherein the phosphor in the wavelength conversion member is $Y_3Al_5O_{12}:Ce^{3+}$ or $Lu_3Al_5O_{12}:Ce^{3+}$.

6. The light-emitting device of claim 2 being a remote phosphor type wherein the wavelength conversion member spaced apart from the LED light source by a gas or vacuum layer.

7. The light-emitting device of claim 1 wherein the pseudo-white light has a color temperature from 3,320K to 5,895K.

* * * * *